US009698183B2

(12) United States Patent
Moeneclaey et al.

(10) Patent No.: US 9,698,183 B2
(45) Date of Patent: Jul. 4, 2017

(54) CMOS IMAGE SENSOR

(71) Applicants: STMicroelectronics (Grenoble 2) SAS, Grenoble (FR); STMicroelectronics (Alps) SAS, Grenoble (FR)

(72) Inventors: Nicolas Moeneclaey, Vourey (FR); Julien-Marc Roux, Eybens (FR); Jerome Bourgoin, Saint Paul de Varces (FR)

(73) Assignees: STMicroelectronics (Grenoble 2) SAS, Grenoble (FR); STMicroelectronics (Alps) SAS, Grenoble (FR)

(*) Notice: Subject to any disclaimer, the term of this patent is extended or adjusted under 35 U.S.C. 154(b) by 203 days.

(21) Appl. No.: 14/744,482

(22) Filed: Jun. 19, 2015

(65) Prior Publication Data
US 2016/0079291 A1    Mar. 17, 2016

(30) Foreign Application Priority Data

Sep. 17, 2014   (FR) ..................................... 14 58770

(51) Int. Cl.
| H04N 5/374 | (2011.01) |
| H01L 27/146 | (2006.01) |
| H04N 5/378 | (2011.01) |
| H04N 5/367 | (2011.01) |
| H04N 17/00 | (2006.01) |
| H04N 5/3745 | (2011.01) |

(52) U.S. Cl.
CPC .. *H01L 27/14612* (2013.01); *H01L 27/14643* (2013.01); *H04N 5/367* (2013.01); *H04N 5/374* (2013.01); *H04N 5/378* (2013.01); *H04N 5/3742* (2013.01); *H04N 5/3745* (2013.01); *H04N 17/002* (2013.01)

(58) Field of Classification Search
CPC ........ H01L 27/14612; H01L 27/14643; H04N 5/3745; H04N 5/3742; H04N 5/367; H04N 5/374; H04N 17/002; H04N 5/378
See application file for complete search history.

(56) References Cited

U.S. PATENT DOCUMENTS

| 9,570,508 | B2* | 2/2017 | Sakurai | ............ H01L 27/14806 |
| 2011/0242379 | A1 | 10/2011 | Kato et al. | |
| 2012/0169909 | A1 | 7/2012 | Rysinski et al. | |
| 2013/0083204 | A1 | 4/2013 | Solhusvik et al. | |
| 2014/0319322 | A1 | 10/2014 | Mandier et al. | |
| 2016/0248409 | A1* | 8/2016 | Song | ........................ H03K 4/48 |
| 2016/0249005 | A1* | 8/2016 | Matsumoto | .......... H04N 5/3658 |

* cited by examiner

*Primary Examiner* — Tony Ko
(74) *Attorney, Agent, or Firm* — Seed IP Law Group LLP

(57) ABSTRACT

A CMOS image sensor including: an array of M×N pixels, the pixels of a same column being connected to a same output track, each pixel including a photodiode, a sense node, a transfer transistor, a reset transistor, and a read circuit; and a test circuit including an assembly of N elementary reference cells respectively connected to the N output tracks of the sensor, each cell including a resistor, a sense node, a transfer transistor, a reset transistor, and a read circuit, the N resistors being series-connected between first and second nodes of application of a reference voltage.

13 Claims, 4 Drawing Sheets

CMOS IMAGE SENSOR

BACKGROUND

Technical Field

The present disclosure relates to the field of CMOS image sensors.

Description of the Related Art

Conventionally, a CMOS image sensor comprises pixels arranged in an array of rows and columns. Each pixel comprises a photodiode, having its junction capacitance discharged by a photocurrent according to a received light intensity. At the end of a period, called image acquisition or integration period, before which the pixel is reset by recharging of its photodiode, the photogenerated charges stored in the photodiode are transferred to a capacitive sense node of the pixel. The illumination level received by the pixel is measured by measurement of the voltage of its sense node. For this purpose, each pixel comprises a read circuit coupling its sense node to an output conductive track. The different output conductive tracks of the sensor are connected to an output stage of the sensor, particularly carrying out functions of sampling, amplification, analog-to-digital conversion, and storage of the levels of signals read from the output tracks. Conventionally, the pixels of a same column of the array are connected to a same output conductive track and the pixels of different columns are connected to different output conductive tracks. Generally, the pixels of a same row are simultaneously read from (in parallel) by the sensor output stage, and the pixels of different rows are successively read from.

BRIEF SUMMARY

An embodiment provides a CMOS image sensor comprising: an array of M rows and N columns of pixels, where the pixels of a same column are connected to a same output conductive track, and the pixels of different columns are connected to different output conductive tracks, each pixel comprising a photodiode, a sense node, a transfer transistor coupling its sense node to a first node of the photodiode, a reset transistor coupling its sense node to a node of application of a pixel reset voltage, and a read circuit coupling its sense node to the output track of the pixel; and a test circuit comprising a first assembly of N elementary reference cells respectively connected to the N output conductive tracks of the sensor, each elementary reference cell comprising a resistor, a sense node, a transfer transistor connecting its sense node to a first node of the resistor, a reset transistor coupling its sense node to a node of application of a cell reset voltage, and a read circuit coupling its sense node to the cell output track, the N resistors of the first assembly being series-connected between first and second nodes of application of a reference voltage.

According to an embodiment, the output conductive tracks are connected to an output stage of the sensor.

According to an embodiment, in each pixel, the read circuit of the pixel comprises an amplification transistor assembled as a follower source, having its gate connected to the sense node of the pixel, and a selection transistor coupling the source of the amplification transistor to the output conductive track of the pixel and, in each elementary reference cell, the read circuit of the cell comprises an amplification transistor assembled as a follower source, having its gate connected to the sense node of the cell, and a selection transistor coupling the source of the amplification transistor to the output conductive track of the cell.

According to an embodiment, the pixels of a same row of the array are simultaneously controllable and the elementary reference cells of the first assembly are arranged along at least a first row of simultaneously-controllable elementary reference cells.

According to an embodiment, the sensor comprises a control circuit capable, during a phase of reading from a row of sensor pixels, of implementing the successive steps of: resetting the sense node of each pixel in the row by turning on its reset transistor; reading the voltage of the sense node of each pixel in the row; turning on the transfer transistor of each pixel in the row; and reading the voltage of the sense node of each pixel in the row.

According to an embodiment, the control circuit is further capable, during a phase of reading from elementary reference cells of the sensor, of implementing the successive steps of: turning on the reset transistor of each cell in the row; reading the voltage of the sense node of each cell in the row; resetting the sense node of each cell in the row by turning on its reset transistor; and reading the voltage of the sense node of each cell in the row.

According to an embodiment, the test circuit comprises a second assembly of N elementary reference cells identical to the elementary reference cells of the first assembly, respectively connected to the N output conductive tracks of the sensor.

According to an embodiment, the N resistors of the second assembly are series-connected between the first and second nodes of application of the reference voltage, so that: the reference cell of the first assembly associated with the conductive track of the first column of the sensor has its resistor connected to the first node of application of the reference voltage; the reference cell of the first assembly associated with the conductive track of the last column of the sensor has its resistor connected to the second node of application of the reference voltage; the reference cell of the second assembly associated with the conductive track of the first column of the sensor has its resistor connected to the second node of application of the reference voltage; and the reference cell of the second assembly associated with the conductive track of the last column of the sensor has its resistor connected to the first node of application of the reference voltage.

According to an embodiment, the cells of the first assembly are arranged along a first row of simultaneously-controllable elementary reference cells, and the cells of the second assembly are arranged along a second row of simultaneously-controllable elementary cells.

According to an embodiment, the cells of the first assembly and the cells of the second assembly are alternately distributed on a first row of simultaneously-controllable elementary reference cells, and on a second row of simultaneously-controllable elementary reference cells.

The foregoing and other features and advantages will be discussed in detail in the following non-limiting description of specific embodiments in connection with the accompanying drawings.

DETAILED DESCRIPTION

Figure 2A:
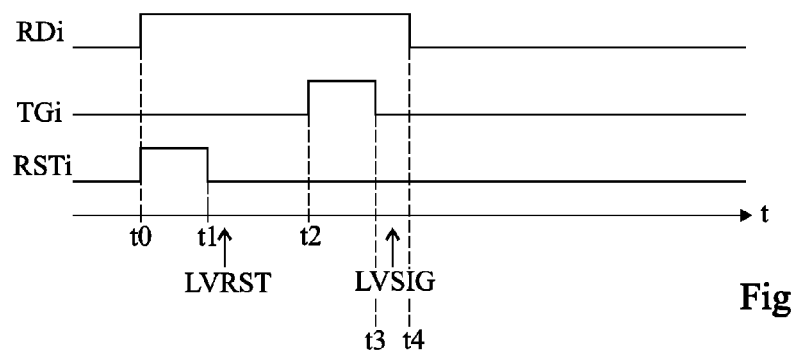
FIGS. 2A and 2B are timing diagrams illustrating an example of a method of controlling the sensor of FIG. 1.
Figure 2B:
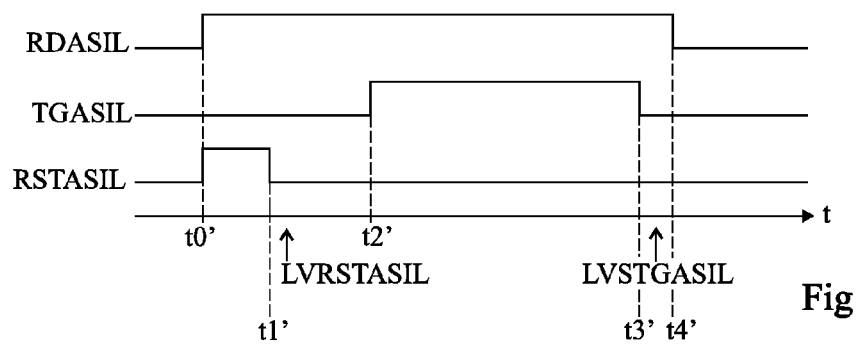
Figure 3:
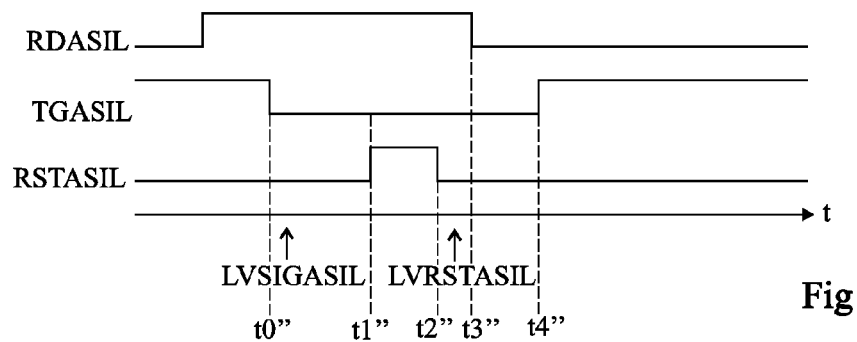
FIG. 3 is a timing diagram illustrating an example of an embodiment of a method of controlling the sensor of FIG. 1.

For clarity, the same elements have been designated with the same reference numerals in the various drawings and, further, the timing diagrams of FIGS. 2A, 2B, and 3 are not to scale. Further, only those elements which are useful to the understanding of the described embodiments have been detailed. In particular, the forming of an output stage of a CMOS image sensor has not been detailed, the described embodiments being compatible with all or most of known CMOS image sensor output stages. It should be noted that in the present description, when pixel, pixel array, or image sensor architectures are described, term "connected" is used to designate a direct electric connection, with no intermediate electronic component, for example, by means of a conductive track, and term "coupled" is used to designate an electronic connection which may be direct or via intermediate components, for example, transistors.

Figure 1:
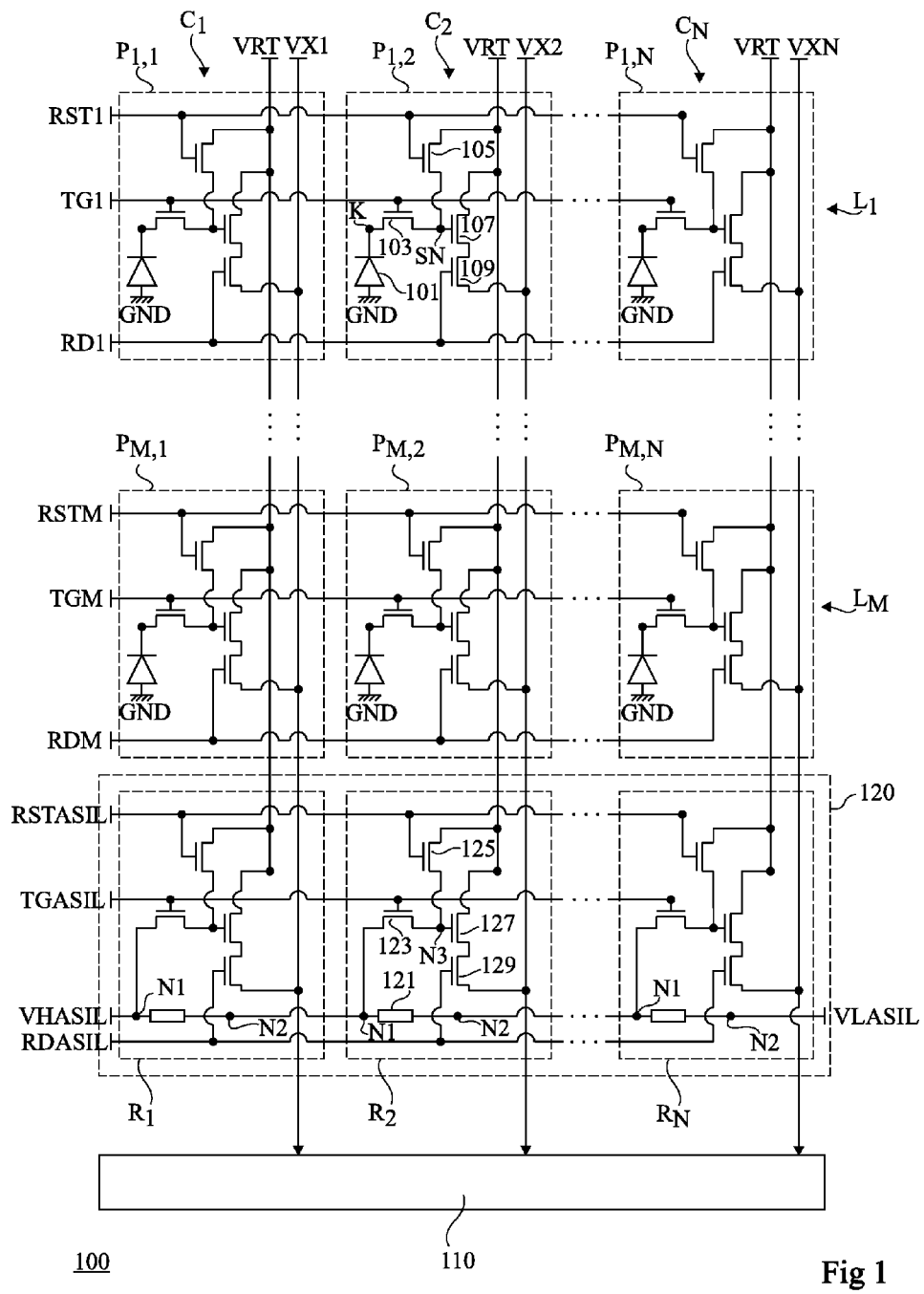
FIG. 1 is a partial electric diagram of an embodiment of a CMOS image sensor.

FIG. 1 is a partial electric diagram of an embodiment of a CMOS image sensor 100.

Sensor 100 comprises an array of M×N identical or similar pixels $P_{i,j}$, arranged along rows $L_i$ and columns $C_j$, M and N being integers, i being an integer in the range from 1 to M, and j being an integer in the range from 1 to N. Each pixel comprises a photodiode 101, a storage node K formed by the cathode of the photodiode, a capacitive sense node SN, a MOS transistor 103 or transfer transistor coupling storage node K to sense node SN, a MOS transistor 105 or reset transistor coupling sensor node SN to a node of application of a high reset voltage VRT, and a read circuit coupling sense node SN to an output conductive track VXj. In this example, in each pixel $P_{i,j}$, the read circuit of the pixel comprises a MOS transistor 107 or amplification transistor, assembled as a follower source, having its gate connected to sense node SN of the pixel, and a MOS transistor 109 or selection transistor, coupling the source of transistor 107 to output track VXj of the pixel. In the shown example, transistors 103, 105, 107, and 109 are N-channel transistors, and the drain of transistor 107 is coupled to a node of application of voltage VRT. Further, in this example, the anode of photodiode 101 is coupled to a node of application of a low reference voltage GND lower than voltage VRT, for example, the ground.

In the example of FIG. 1, each pixel column $C_j$ is assigned an output conductive track VXj. Thus, the pixels of a same column are connected, via their read circuits (and more particularly via their selection transistors 109 in this example), to a same output conductive track VXj, and the different column pixels are connected, via their read circuits (and more particularly via their selection transistors (109 in this example), to different output conductive tracks VXj.

The different output conductive tracks VXj of sensor 100 are connected to an output stage 110 of the sensor, particularly carrying out functions of sampling, amplification, analog-to-digital conversion, and storage of the levels of signals read from output tracks VXj.

Further, in the example of FIG. 1, each pixel row $L_i$ is associated: a node of application of a signal TGi for controlling transfer transistors 103 of the row pixels; a node of application of a signal RSTi for controlling reset transistors 105 of the row pixels; and a node of application of a signal RDi for controlling selection transistors 109 of the row pixels. Thus: the gates of transistors 103 of the pixels of a same row are connected to a same control node TGi, the gates of transistors 103 of the pixels of different rows being connected to different control nodes TGi; the gates of transistors 105 of the pixels of a same row are connected to a same control node RSTi, the gates of transistors 105 of the pixels of different rows being connected to different control nodes RSTi; and the gates of transistors 109 of the pixels of a same row are connected to a same control node RDi, the gates of transistors 109 of the pixels of different rows being connected to different control nodes RDi.

Sensor 100 comprises a row decoder, not shown, capable of delivering to the different rows $L_i$ of the array the corresponding control signals TGi, RSTi, and RDi.

According to an aspect of an embodiment, sensor 100 further comprises a test circuit 120 comprising an assembly of N identical or similar elementary reference cells $R_j$, respectively connected to the N output conductive tracks VXj of the sensor. Each elementary reference cell $R_j$ comprises a resistor 121 connected between nodes N1 and N2 of the cell, a capacitive sense node N3, a MOS transistor 123 or transfer transistor, coupling node N1 of the cell to its sense node N3, a MOS transistor 125 or reset transistor, coupling sense node N3 of the cell to a node of application of a reset voltage, voltage VRT in the present example, and a read circuit coupling sense node N3 to the output conductive track VXj associated with cell $R_j$. In the shown example, each cell $R_j$ is connected, via its read circuit, to one and only one output conductive track VXj of the sensor (that is, the output conductive track VXj of same rank j as the cell), and the different cells $R_j$ are connected, via their read circuits, to different output conductive tracks VXj. In this example, in each elementary cell $R_j$, the read circuit of the cell comprises a MOS transistor 127 or amplification transistor, assembled as a follower source, having its gate connected to sense node N3 of the cell, and a MOS transistor 129 or selection transistor, coupling the source of transistor 127 to output track VXj associated with the cell. In the shown example, transistors 123, 125, 127, and 129 are N-channel transistors, and the drain of transistor 127 is coupled to a node of application of voltage VRT. In this example, each elementary reference cell $R_j$ of test circuit 120 differs from a pixel $P_{i,j}$ of the sensor only in that, in cell $R_j$, photodiode 101 of pixel $P_{i,j}$ is replaced with a resistor 121. In this example, the anode and cathode nodes of photodiode 101 are respectively replaced with nodes N2 and N1 of resistor 121.

The N resistors 121 of test circuit 120 are series-connected between a node of application of a first reference voltage VHASIL and a node of application of a second reference voltage VLASIL lower than voltage VHASIL. In the example of FIG. 1, each cell $R_j$, except for cell $R_N$, has its node N2 connected to node N1 of the cell of higher rank $R_{j+1}$. Further, in this example, node N1 of cell $R_1$ is connected to the node of application of voltage VHASIL, and node N2 of cell $R_N$ is connected to the node of application of voltage VLASIL. In operation, when voltage VHASIL-VLASIL is applied across the series association of resistors 121, each cell $R_j$ has its node N1 at a reference voltage specific to the cell, in the voltage range from VHASIL to VLASIL, this reference voltage being independent from the sensor illumination level. Voltages VHASIL and VLASIL, and the values of resistances 121, are for example selected so that the reference voltages of the different cells $R_j$ are regularly distributed in the range of voltages capable of being taken by storage nodes K of the sensor pixels in conditions of normal use of the sensor.

In the example of FIG. 1, the test circuit further comprises: a node of application of a signal TGASIL for controlling transfer transistors 123 of cells $R_j$; a node of application of a signal RSTASIL for controlling reset transistors 125 of cells $R_j$; and a node of application of a signal RDASIL for controlling selection transistors 129 of cells $R_j$. The gates of transistors 123 of cells $R_j$ are connected to control node TGASIL, the gates of transistors 125 of cells $R_j$ are connected to control node RSTASIL, and the gates of transistors 129 of cells $R_j$ are connected to control node RDASIL.

Control signals TGASIL, RSTASIL, and RDASIL of test circuit 120 are for example delivered by the row decoder (not shown) of sensor 100, or by any other adapted circuit.

On acquisition of an image, the pixels may be initialized, integrated, and then read from row by row, according to overlapping control cycles. As an example, all the pixels of a selected row, or current row, are initialized, integrated, and read from at the same time during a row acquisition cycle. The pixels of the next row (in the sensor row browsing order) are initialized, integrated, and read from during a control cycle which partially overlaps the control cycle of the current row, with a time shift with respect to the control cycle of the current row. The reading from the pixels of a row is performed via output stage 110, via the different output tracks VXj of the sensor.

During an integrity phase test of output stage 110 of the sensor, the N reference cells $R_j$ of test circuit 120 may be simultaneously controlled according to a control cycle similar to the read cycle of pixels $P_{i,j}$ of a row $L_i$ of the array, enabling, in each cell $R_j$, to transfer onto sense node N3 of the cell, via transfer transistor 123, and then on output track VXj of the cell via read circuit 127, 129, a voltage representative of the reference voltage available on node N1 of the cell. Thus, circuit 120 delivers, on output tracks $VX_j$ of the sensor, a set of reference values. These reference values are read via output stage 110, via the same read chains as those used to read the output values of pixels $P_{i,j}$ of the sensor. At the end of a phase of reading from cells $R_j$, the values delivered by output stage 110, for example, digital values in the case where output stage 110 carries out an analog-to-digital conversion, may be compared with reference values stored in a memory, not shown, to detect a possible failure of output stage 110 and/or of output tracks $VX_j$ of the sensor. In particular, if the values delivered by output stage 110 are different from the expected reference values, the existence of a failure of output stage and/or of output tracks $VX_j$ of the sensor can be deduced.

FIGS. 2A and 2B are timing diagrams illustrating in further detail an example of a method of controlling the sensor of FIG. 1.

FIG. 2A more particularly shows the variation of control signals RDi, TGi, and RSTi during a phase of reading from a row $L_i$ of sensor pixels, at the end of a period of integration of the pixels of row $L_i$.

At a time t0 of beginning of the read phase, reset transistors 105 of the pixels of row $L_i$ are set to the on state (signal RSTi in the high state in this example) to reset the voltage of sense node SN of each pixel in the row. Transistors 103 of the row pixels are maintained in the off state (signal TGi in the low state in this example).

At a time t1 subsequent to time t0, transistors 105 of the pixels of row $L_i$ are turned off (signal RSTi in the low state in this example), to isolate sense nodes SN of the pixels in the row from voltage VRST.

After time t1, the voltage of sense node SN of each pixel $P_{i,j}$ of row $L_i$ is read and stored during a step LVRST, via the read circuit (transistors 107 and 109) of the pixel, output track VXj associated with the pixel, and output stage 110 of the sensor. At step LVRST, selection transistors 109 of the pixels of row $L_i$ are in the on state (signal RDi in the high state in this example), thus coupling sense node SN of each pixel $P_{i,j}$ of row $L_i$ to output track VXj of the pixel. In the shown example, selection transistors 109 of the pixels of row $L_i$ are turned on at time t0.

After step LVRST, at a time t2, transfer transistors 103 of the pixels of row $L_i$ are turned on (signal TGi in the high state in this example), which causes, in each pixel of row $L_i$, the transfer, onto sense node SN of the pixel, of the photogenerated charges stored in the pixel photodiode during the integration. The voltage of sensor node SN then decreases by a value representative of the quantity of photogenerated charges stored in the photodiode during the integration.

At a time t3 subsequent to time t2, transfer transistors 103 of the pixels of row $L_i$ are turned back off (signal TGi in the low state in this example), to isolate, in each pixel of row $L_i$, sense node SN of storage node K. Time t3 marks the end of the integration period of the pixels of row $L_i$.

After time t3, the voltage of sense node SN of each pixel $P_{i,j}$ of row $L_i$ is read and stored during a step LVSIG, via the read circuit (transistors 107 and 109) of the pixel, output track VXj associated with the pixel, and output stage 110 of the sensor. During step LVSIG, selection transistors 109 of the pixels of row $L_i$ are still in the on state. After step LVSIG, at a time t4, selection transistors 109 of the pixels of row $L_i$ may be turned back off (signal RDi in the low state in this example).

After read step LVSIG, output stage 110 delivers, for each pixel $P_{i,j}$ of row $L_i$, an output value representative of the difference between the voltage read from output track VXj of the pixel at step LVRST and the voltage read from output track VXj of the pixel at step LVSIG.

An advantage of this read method is that it is particularly noise-resistant, and particularly enables to significantly decrease the influence of the reset node introduced by transistors 105 on the pixel output values.

FIG. 2B shows the variation of control signals RDASIL, TGASIL, and RSTASIL during a phase of reading from the assembly of reference cells $R_j$ of test circuit 120 of the sensor.

As a non-limiting example, the reading from reference cells $R_j$ is carried out before or after the acquisition of an image by the sensor.

At a time t0' of beginning of the phase of reading from cells $R_j$, reset transistors 125 of cells $R_j$ are set to the on state (signal RSTASIL in the high state in this example) to reset the voltage of the sense node N3 of each cell. Transistors 123 of cells $R_j$ are maintained in the off state (signal TGASIL in the low state in this example).

At a time t1' subsequent to time t0', transistors 125 of cells $R_j$ are turned off (signal RSTASIL in the low state in this example), to isolate sense nodes N3 of cells $R_j$ from voltage VRST.

After time t1', the voltage of sense node N3 of each cell $R_j$ is read and stored during a step LVRSTASIL, via the cell read circuit (transistors 127 and 129), output track VXj associated with the cell, and output stage 110 of the sensor. At step LVRSTASIL, selection transistors 129 of cells $R_j$ are in the on state (signal RDASIL in the high state in this example), thus coupling sense node N3 of each cell $R_j$ to output track VXj of the cell. In the shown example, selection transistors 129 of cells $R_j$ are turned on at time t0'.

After step LVRSTASIL, at a time t2', transfer transistors 123 of cells $R_j$ are turned on (signal TGASIL in the high state in this example), which causes, in each cell $R_j$, a decrease in the voltage of sense node N3 of the cell representative of the reference voltage available on node N1 of the cell.

At a time t3' subsequent to time t2', transfer transistors 123 of cells $R_j$ are turned back off (signal TGASIL in the low state in this example), to isolate, in each cell $R_j$, sense node N3 of the cell from its node N1.

After time t3', the voltage of sense node N3 of each cell $R_j$ is read and stored during a step LVSIGASIL, via the cell read circuit (transistors 127 and 129), output track VXj associated with the cell, and output stage 110 of the sensor. During step LVSIGASIL, selection transistors 129 of cells $R_j$ are still in the on state. After step LVSIGASIL, at a time t4', selection transistors 129 of cells $R_j$ may be turned back off (signal RDASIL in the low state in this example).

After read step LVSIGASIL, output stage 110 delivers, for each cell $R_j$ of test circuit 120, an output value representative of the difference between the voltage read from output track VXj of the cell at step LVRSTASIL, and the voltage read from output track VXj of the cell at step LVSIGASIL.

Thus, in this example, the method of reading from elementary reference cells $R_j$ of test circuit 120 of the sensor of FIG. 1 is substantially identical to the method of reading from the pixels of a pixel row $L_i$ of the sensor. In particular, the control sequence of transistors 123, 125, and 129 of cells $R_j$ and of output stage 110 applied during a phase of reading from cells $R_j$ is substantially the same as the control sequence of transistors 103, 105, and 109 of pixels $P_{i,j}$ and of output stage 110 applied in a phase of reading from a pixel row $L_i$.

However, as appears in FIGS. 2A and 2B, during the phase of reading from reference cells $R_j$, time period t3'-t2' during which transfer transistors 123 of the cells are maintained in the on state (signal TGASIL in the high state) is much longer than time period t3-t2 during which transfer transistors 103 of the pixels are set to the on state (signal TGi in the high state) during a phase of reading from a pixel row $L_i$ of the sensor.

Indeed, due to the series connection of resistors 121 between nodes VHASIL and VLASIL, cells Rj have a particularly high time constant (RC). As a result, in each cell $R_j$, the time to stabilize the voltage of sense node N3 due to the setting on state of transfer transistor 123 is much longer than the time to stabilize the voltage of sense node SN of a pixel $P_{i,j}$ after the setting to the on state of its transfer transistor 103. It should be noted that in test circuit 120, the different cells $R_j$ may have different time constants, according to their position with respect to ends VHASIL and VLASIL of the chain of reference cells $R_j$. However, all cells $R_j$ being read simultaneously, the stabilization time to be taken into account is that of the cell having the highest time constant.

As an illustrative non-limiting example, for a sensor having N×M=1,312×988 pixels, the stabilization time of the voltages of sense nodes N3 of cells $R_j$ after the turning-on of transistors 123 of the cells is approximately 30 µs, while the duration of the phase of reading from a row of sensor pixels is typically shorter than 5 µs.

This may raise issues in certain applications. As a non-limiting example, in the field of CMOS image sensors embarked in motor vehicles, it may be desirable to perform an integrity checking of output stage 110 before, after, and/or during each acquisition of an image by the sensor. However, if a control method of the type described in relation with FIGS. 2A and 2B is implemented, this may result in a significant slowing of the rate of image acquisition by the sensor, which is not desirable.

FIG. 3 is a timing diagram illustrating an embodiment of a method of controlling the sensor of FIG. 1. FIG. 3 more specifically shows the variation of control signals RDASIL, TGASIL, and RSTASIL during a phase of reading from reference cells $R_j$ of test circuit 120 of the sensor. In this example, the control of pixels $P_{i,j}$ and of output stage 110 during a phase of reading from a pixel row $L_i$ of the sensor is identical or similar to what has been described in relation with FIG. 2A, and will thus not be described again hereafter. In particular, control signals RDi, TGi, and RSTi have not been shown in FIG. 3.

According to an aspect of the embodiment of FIG. 3, the step (LVSIGASIL) of reading the reference voltages of cells $R_j$ is carried out before the step (LVRSTASIL) of reading the cell reset voltages.

In the example of FIG. 3, transfer transistors 123 of cells $R_j$ of test circuit 120 are set to the on state (signal TGASIL in the high state in this example) long before the beginning of the actual phase of reading from cells $R_j$. As a non-limiting example, transistors 123 are turned on at the beginning of a phase of image acquisition by sensor 100, and the actual step of reading from cells $R_j$ is carried out at an intermediate stage or after the end of the image acquisition phase, and in any case at a time sufficiently distant form the turning-on of transistors 123, so that the stabilization of the voltages of sense nodes N3 of cells $R_j$ is over.

At a time t0" of beginning of the phase of reading from cells $R_j$, transfer transistors 123 of cells $R_i$ are set to the off state (signal TGASIL in the low state in this example) to isolate sense node N3 of each cell from its node N1.

After time t0", the voltage of sense node N3 of each cell $R_j$, representative of the cell reference voltage, is read and stored during a step LVSIGASIL, via the cell read circuit (transistors 127 and 129), output track VXj associated with the cell, and output stage 110 of the sensor. At step LVSIGASIL, selection transistors 129 of cells $R_j$ are in the on state (signal RDASIL in the high state in this example), thus coupling sense node N3 of each cell $R_j$ to output track VXj of the cell. In the shown (non-limiting) example, selection transistors 129 of cells $R_j$ are turned on little before time t0".

After step LVSIGASIL, at a time t1", reset transistors 125 of cells $R_j$ are turned on (signal RSTASIL in the high state in this example) to reset the voltage of sense node N3 of each cell. Transistors 123 of cells $R_j$ are maintained in the off state (signal TGASIL in the low state in this example).

At a time t2" subsequent to time t1", transistors 125 of cells $R_j$ are turned off (signal RSTASIL in the low state in this example), to isolate sense nodes N3 of cells $R_j$ from voltage VRST.

After time t2", the voltage of sense node N3 of each cell $R_j$ is read and stored during a step LVRSTASIL, via the read circuit (transistors 127 and 129) of the cell, output track VXj associated with the cell, and output stage 110 of the sensor. During step LVRSTASIL, selection transistors 129 of cells $R_j$ are still in the on state (signal RDASIL in the high state in this example). After step LVRSTASIL, at a time t3", selection transistors 129 of cells $R_j$ may be turned back off (signal RDASIL in the low state in this example).

After read step LVRSTASIL, output stage 110 delivers, for each cell $R_j$ of test circuit 120, an output value representative of the difference between the voltage read from output track VXj of the cell at step LVRSTASIL, and the voltage read from output track VXj of the pixel at step LVSIGASIL.

At the end of the read phase, after read step LVRSTASIL, for example, after time t4", transfer transistors 123 of cells $R_j$ may be turned by on (signal TGASIL in the high state in this example), until the next phase of reading from cells $R_j$.

An advantage of the embodiment of FIG. 3 is that the period of stabilizing sense nodes N3 of reference cells $R_j$ is prior to the actual phase of reading from cells $R_j$, and in particular to the reading of the voltages of nodes N3 via output tracks VXj and output stage 110 of the sensor. Thus, during the period of stabilization of sense nodes N3 of cells $R_j$, phases of reading from pixel rows $L_i$ of the sensor may be implemented, which is a difference with the example of control method of FIGS. 2A and 2B. The time exclusively dedicated to the integrity test of output stage 110 and/or of conductive tracks VXj is thus decreased with respect to the example of control method of FIGS. 2A and 2B. In particular, the control method described in relation with FIG. 3 enables to carry out integrity tests on the assembled formed by output conductive tracks VXj and output stage 110 of the sensor along the acquisition of the images by the sensor, without interrupting or significantly slowing the image acquisition by the sensor.

It should be noted that in the example of FIG. 1, elementary reference cells $R_j$ are reset to the same reference voltage VRT as pixels $P_{i,j}$. The described embodiments are however not limited to this specific case. In the example of FIG. 1, reset voltage VRT of pixels $P_{i,j}$ and reference cells $R_j$ is a high voltage, that is, it is greater than the voltage taken by node K of a pixel in the absence of charges photogenerated in the pixel photodiode. As a variation, it may be provided to reset pixels $P_{i,j}$ to high voltage VRT, and instead of resetting cells $R_j$ to voltage VRT, to reset them to a low voltage VRT', lower than the voltage taken by node K of the sensor pixels in the absence of photogenerated charges, for example, voltage VLASIL. To achieve this, in each elementary reference cell $R_j$, sense node N3 of the cell, instead of being coupled, via reset transistor 125 of the cell, to a node of application of voltage VRT, is coupled to a node of application of voltage VRT'. This is particularly advantageous when the control method described in relation with FIG. 3 is used. Indeed, in this case, output stage 110 delivers, for each sensor pixel, an output value equal to the difference between two voltage values, respectively high (reset voltage) and low (voltage after transfer of photogenerated charges), successively acquired, and, for each elementary reference cell, an output value equal to the difference between two voltage values, respectively high (reference voltage of the cell) and low (cell reset voltage), successively acquired. The same subtraction circuits of the output stage may thus be used with no modification, to calculate these differences. This alternative embodiment is compatible not only with the embodiment of FIG. 1, but also with the variations of FIGS. 4 and 5, described hereafter.

Figure 4:
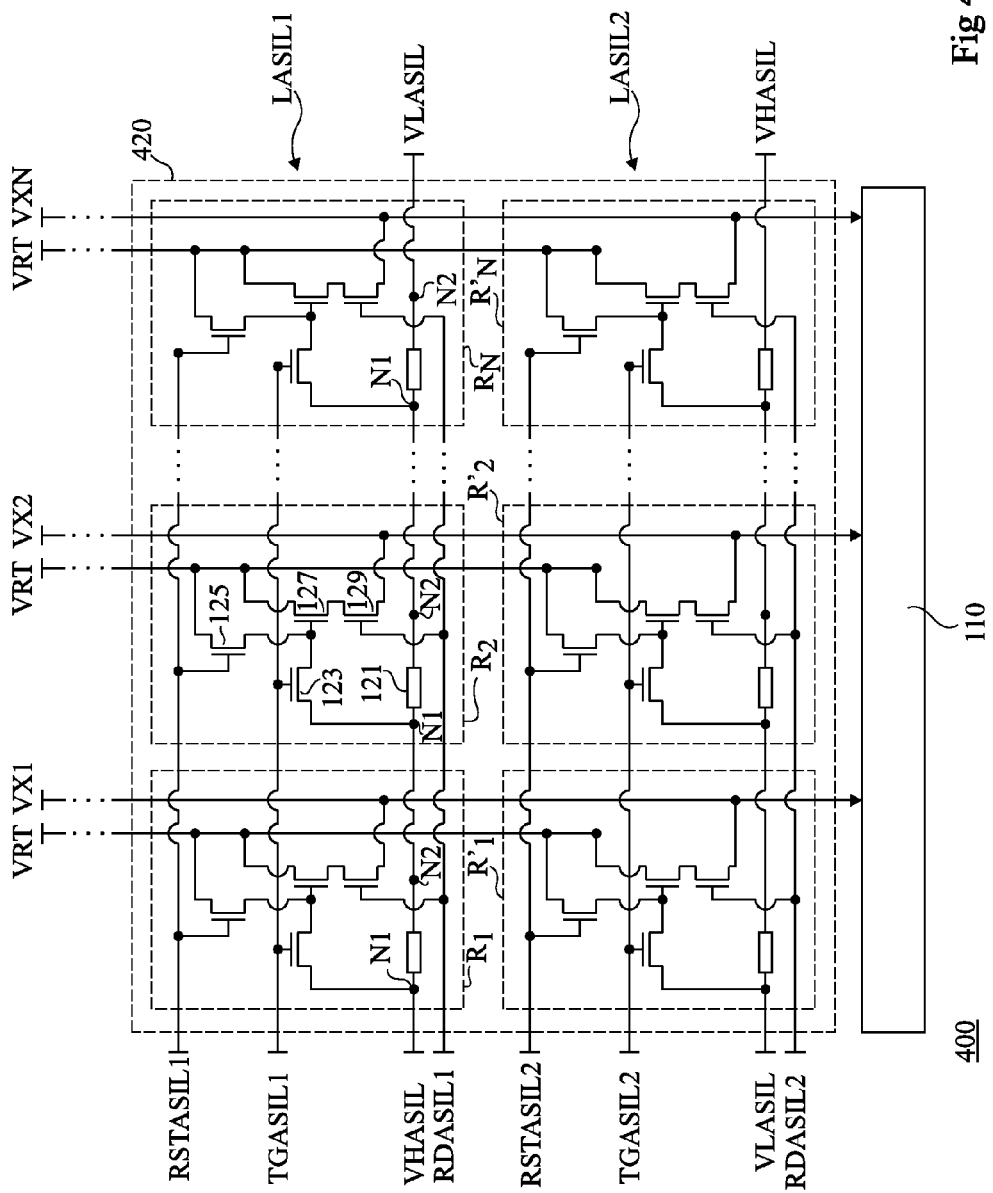
FIG. 4 is a partial electric diagram of an alternative embodiment of a CMOS image sensor.

FIG. 4 is a partial electric diagram of an alternative embodiment of a CMOS image sensor. Sensor 400 of FIG. 4 comprises elements common with sensor 100 of FIG. 1. In particular, sensor 400 of FIG. 4 comprises a pixel array, not shown in FIG. 4, identical or similar to that of sensor 100 of FIG. 1. In the following, only the differences between sensors 100 and 400 will be detailed.

Sensor 400 of FIG. 4 differs from sensor 100 of FIG. 1 by the architecture of its integrity test circuit.

Sensor 400 comprises a test circuit 420 comprising a first assembly of N identical or similar elementary reference cells $R_j$, respectively connected to the N conductive output tracks VXj of the sensor. Elementary reference cells $R_j$ of sensor 400 are for example identical to cells $R_j$ of sensor 100 of FIG. 1, and substantially connected in the same way as in the example of FIG. 1, that is, each cell $R_j$ is connected, via its read circuit (and more particularly via its selection transistor 129 in this example), to one and only one output conductive track VXj of the sensor (that is, the output conductive track VXj of same rank j as the cell), and the different cells $R_j$ are connected, via their read circuits (and more particularly via their selection transistors 129 in this example), to different output conductive tracks VXj. Further, as in the example of FIG. 1, the N resistors 121 of the assembly of cells $R_j$ are series-connected between a node of application of a first reference voltage VHASIL and a node of application of a second reference voltage VLASIL lower than voltage VHASIL. In the example of FIG. 1, each cell $R_j$, except for cell $R_N$, has its node N2 connected to node N1 of the cell of higher rank $R_{j+1}$. Further, in this example, node N1 of cell $R_1$ is connected to the node of application of voltage VHASIL, and node N2 of cell $R_N$ is connected to the node of application of voltage VLASIL.

In the example of FIG. 4, test circuit 420 further comprises a second assembly of N identical or similar elementary reference cells $R'_j$, respectively connected to the N output conductive tracks VXj of the sensor. Cells $R'_j$ are for example identical to cells $R_j$. In the shown example, each cell $R'_j$ is connected, via its read circuit (and more particularly via its selection transistor 129 in this example), to one and only one output conductive track VXj of the sensor (that is, output conductive track VXj of same rank j as the cell), and the different cells $R'_j$ are connected, via their read circuits (and more particularly via their selection transistors 129 in this example), to different output conductive tracks VXj. The N resistors 121 of the assembly of cells $R'_j$ are series-connected between a node of application of voltage VLASIL and a node of application of voltage VHASIL. In the shown example, each cell $R'_j$, except for cell $R'_N$, has its node N2 connected to node N1 of the cell of higher rank $R'_{j+1}$. Further, in this example, node N1 of cell $R'_1$ is connected to the node of application of voltage VLASIL, and node N2 of cell $R'_N$ is connected to the node of application of voltage VHASIL.

In the example of FIG. 4, cells $R_j$ are arranged along a first row LASIL1 of elementary reference cells, and cells $R'_j$ are arranged along a second row LASIL2 of elementary reference cells.

The test circuit further comprises: a node of application of a signal TGASIL1 for controlling transfer transistors 123 of the cells of row LASIL1; a node of application of a signal TGASIL2 for controlling the transfer transistors 123 of the cells of row LASIL2; a node of application of a signal RSTASIL1 for controlling the reset transistors 125 of the cells of row LASIL1; a node of application of a signal RSTASIL2 for controlling the reset transistors 125 of the cells of row LASIL2; a node of application of a signal RDASIL1 for controlling the selection transistors 129 of the cells of row LASIL1; and a node of application of a signal RDASIL2 for controlling the selection transistors 129 of the cells of LASIL2.

Control signals TGASIL1, TGASIL2, RSTASIL1, RSTASIL2, RDASIL1, and RDASIL2 of test circuit 420 are for example delivered by the row decoder (not shown) of sensor 400, or by any other adapted circuit.

Sensor 400 of FIG. 4 may be controlled similarly to what has been described in relation with FIGS. 1, 2A, 2B, and 3, with the difference that, in sensor 400, in a phase of testing the integrity of output stage 110 of the sensor, rows LASIL1 and LASIL2 of elementary reference cells are read successively (the cells of a same row being read simultaneously).

An advantage of the sensor of FIG. 4 over the sensor of FIG. 1 is that, in the example of FIG. 4, each column of the sensor may be tested with two different reference values, which increases error detection possibilities.

Figure 5:
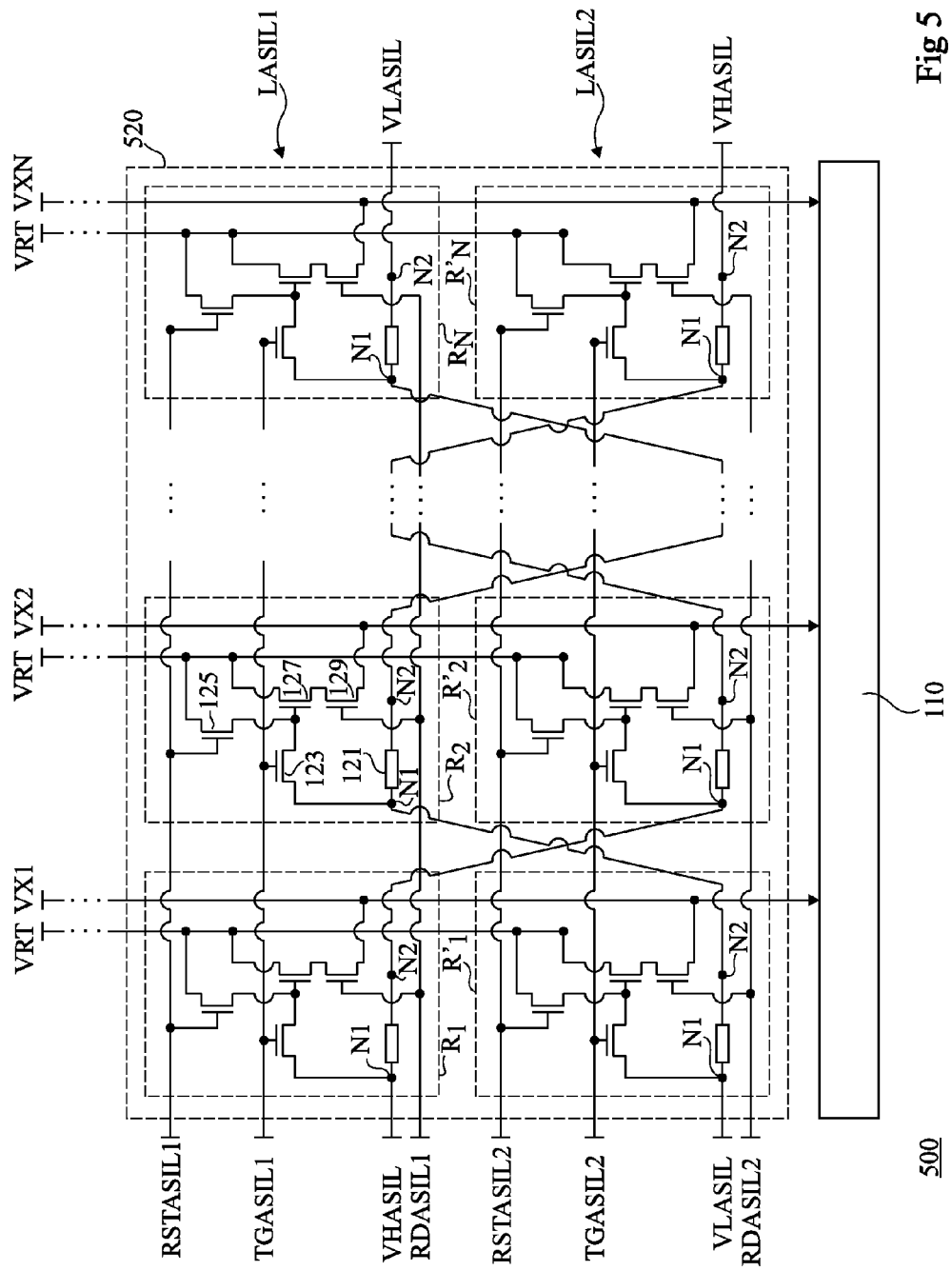
FIG. 5 is a partial electric diagram of another alternative embodiment of a CMOS image sensor.

FIG. 5 is a partial electric diagram of another alternative embodiment of a CMOS image sensor. Sensor 500 of FIG. 5 comprises elements common with sensor 400 of FIG. 4. In the following, only the differences between sensors 400 and 500 will be detailed.

Sensor 500 comprises a test circuit 520 comprising, as in the example of FIG. 4, a first assembly of N identical or similar elementary reference cells $R_j$, respectively connected to the N output conductive tracks VXj of the sensor, and a second assembly of N identical or similar elementary reference cells $R'_j$, respectively connected to the N output conductive tracks VXj of the sensor. Elementary reference cells $R_j$ and $R'_j$ of sensor 500 are for example identical to cells $R_j$ of sensor 100 of FIG. 1. As in the example of FIG. 4, each cell $R_j$, respectively $R'_j$ is connected, via its read circuit, to one and only one output conductive track VXj of the sensor (that is, the output conductive track VXj of same rank j as the cell), and the different cells $R_j$, respectively $R'_j$, are connected, via their read circuits, to different output conductive tracks VXj. Further, as in the example of FIG. 4, the N resistors 121 of the assembly of cells $R_j$ are series-connected between a node of application of voltage VHASIL and a node of application of voltage VLASIL, and the N resistors 121 of the assembly of cells $R'_j$ are series-connected between a node of application of reference voltage VLASIL and a node of application of voltage VHASIL. More particularly, in the example of FIG. 5, each cell $R_j$, respectively $R'_j$, except for cell $R_N$, respectively $R'_N$, has its node N2 connected to node N1 of the cell of higher rank $R_{j+1}$, respectively $R'_{j+i}$, cell $R_1$ has its node N1 connected to a node of application of voltage VHASIL, cell $R_N$ has its node N2 connected to a node of application of voltage VLASIL, cell $R'_1$ has its node N1 connected to a node of application of voltage VLASIL, and cell $R'_N$ has its node N2 connected to a node of application of voltage VHASIL.

Cells $R_j$ and $R'_j$ are arranged along two rows LASIL1 and LASIL2 of elementary reference cells. However, test circuit 520 of the sensor of FIG. 5 differs from test circuit 420 of the sensor of FIG. 4 in that, in the example of FIG. 5, the chain of cells $R_j$ and the chain of cells $R'_j$ are interlaced. In other words, cells $R_j$ are arranged in alternated fashion in row LASIL1 and in row LASIL2, and cells $R'_j$ are arranged in alternated fashion in row LASIL2 and in row LASIL1. Thus, row LASIL1 comprises an alternation of cells $R_j$ and of cells $R'_j$, and row LASIL2 comprises an alternation of cells $R'_j$ and of cells $R_j$. In the (non limiting) example of FIG. 5, the elementary reference cells of odd rank of row LASIL1 are cells $R_j$, the elementary reference cells of even rank of row LASIL1 are cells $R'_j$, the elementary reference cells of odd rank of row LASIL2 are cells $R'_j$, and the elementary reference cells of even rank of row LASIL2 are cells $R_j$.

Test circuit 520 further comprises, as in the example of FIG. 4: a node of application of a signal TGASIL1 for controlling the transfer transistors 123 of the cells of row LASIL1; a node of application of a signal TGASIL2 for controlling the transfer transistors 123 of the cells of row LASIL2; a node of application of a signal RSTASIL1 for controlling the reset transistors 125 of the cells of row LASIL1; a node of application of a signal RSTASIL2 for controlling the reset transistors 125 of the cells of row LASIL2; a node of application of a signal RDASIL1 for controlling the selection transistors 129 of the cells of row LASIL1; and a node of application of a signal RDASIL2 for controlling the selection transistors 129 of the cells of LASIL2.

Control signals TGASIL1, TGASIL2, RSTASIL1, RSTASIL2, RDASIL1, and RDASIL2 of test circuit 520 are for example delivered by the row decoder (not shown) of sensor 500, or by any other circuit configured to provide those signals.

Sensor 500 of FIG. 5 may be controlled similarly to that of FIG. 4.

An advantage of the sensor of FIG. 5 over the sensor of FIG. 4 is that, in the example of FIG. 5, during a phase of reading from a row LASIL1 or LASIL2 of elementary reference cells, neighboring columns of the sensor are tested with relatively distant reference values. For example, during a phase of reading from row LASIL1 of elementary reference cells, the column of rank 1 of the sensor is tested with a reference value close or equal to voltage VHASIL, and the neighboring column of rank 2 is tested with a reference value close to voltage VLASIL. This enables to improve the error detection possibilities of the test circuit, and particularly to detect possibly abnormal couplings between neighboring output tracks VXj of the sensor.

Specific embodiments have been described. Various alterations, modifications, and improvements will readily occur to those skilled in the art.

In particular, the described embodiments are not limited to the examples of pixel and elementary reference cell architectures described hereabove. It will in particular be within the abilities of those skilled in the art to adapt the described embodiments to other types of pixel architectures, for example, architectures of the type described in French patent application No 13/53841, or more generally, to any CMOS image sensor where each pixel comprises a photodiode coupled to a sense node via a transfer transistor and a read circuit coupling the pixel sense node to an output track of the pixel.

Further, the described embodiments are not limited to the specific above-mentioned examples where all the MOS transistors of the pixels and of the reference cells are N-channel transistors. As a variation, part or all of the pixel transistors and/or of the reference cells may be replaced with P-channel transistors. As an example, in the above-described embodiments, in each elementary reference cell of the test circuit, transfer transistor 123 may be replaced with a P-channel MOS transistor.

Further, the described embodiments are not limited to the specific examples shown in FIGS. 1, 4, and 5, where the elementary reference cells of the test circuits are arranged at the foot of columns with respect to the sensor pixel array, that is, between the pixel array and output stage 110 of the sensor. As a variation, the elementary reference cells may be arranged at the top of a column, or at an intermediate level of the pixel array.

Such alterations, modifications, and improvements are intended to be part of this disclosure, and are intended to be within the spirit and the scope of the present disclosure. Accordingly, the foregoing description is by way of example only and is not intended to be limiting.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

What is claimed is:

1. A CMOS image sensor comprising:
    an image array including M rows and N columns of pixels and N output conductive tracks corresponding respectively to the N columns, where for each column, the pixels of the column are connected to the corresponding output conductive track, and the pixels of different columns are connected to different output conductive tracks, each pixel including a photodiode, a sense node, a transfer transistor coupling the sense node to a first node of the photodiode, a reset transistor coupling the sense node to a pixel reset voltage node, and a read circuit coupling the sense node to the output conductive track corresponding to the column that includes the pixel; and
    a test circuit including a first assembly of N elementary reference cells respectively coupled to the N output conductive tracks, each elementary reference cell including a resistor, a sense node, a transfer transistor coupling the sense node of the elementary reference cell to a first node of the resistor, a reset transistor coupling the sense node of the elementary reference cell to a cell reset voltage node, and a read circuit coupling the sense node of the elementary reference cell to the output track to which the elementary reference cell is coupled, the resistors of said first assembly being series-coupled between first and second reference voltage nodes.

2. The sensor of claim 1, comprising an output stage coupled to said output conductive tracks.

3. The sensor of claim 1, wherein:
    in each pixel, the read circuit of the pixel comprises an amplification transistor assembled as a source follower, having a gate coupled to the sense node of the pixel, and a selection transistor coupling a source of the amplification transistor to the output conductive track corresponding to the column that includes the pixel, and
    in each elementary reference cell, the read circuit of the cell comprises an amplification transistor assembled as a source follower, having a gate coupled to the sense node of the cell, and a selection transistor coupling a source of the amplification transistor to the output conductive track to which the cell is coupled.

4. The sensor of claim 1, wherein each row includes a first control line coupled to respective control nodes of the pixels of the row, and wherein the test circuit includes a first row that includes the elementary reference cells of the first assembly and a second control line coupled to respective control nodes of the elementary reference cells.

5. The sensor of claim 4, comprising a control circuit configured to successively implement:
    resetting the sense node of each pixel in a selected row of the rows of the image array by turning on the reset transistors of the pixels of the selected row;
    reading a voltage of the sense node of each pixel in the selected row;
    turning on the transfer transistor of each pixel in the selected row; and
    reading the voltage of the sense node of each pixel in the selected row.

6. The sensor of claim 5, wherein said control circuit is further configured to successively implement:
    turning on the transfer transistor of each cell in the row of the test circuit;
    reading a voltage of the sense node of each cell in the row of the test circuit;
    resetting the sense node of each cell in the row of the test circuit by turning on the reset transistor of each cell; and
    reading the voltage of the sense node of each cell in the row of the test circuit.

7. The sensor of claim 1, wherein the test circuit comprises a second assembly of N elementary reference cells respectively coupled to the N output conductive tracks of the sensor, each elementary reference cell of the second assembly including a resistor, a sense node, a transfer transistor coupling the sense node of the elementary reference cell to a first node of the resistor of the elementary reference cell, a reset transistor coupling the sense node of the elementary reference cell to a reset voltage node, and a read circuit coupling the sense node of the elementary reference cell to the output track to which the elementary reference cell is coupled, the resistors of said second assembly being series-coupled between the first and second reference voltage nodes.

8. The sensor of claim 7, wherein:
    the resistor of the reference cell of the first assembly coupled to the conductive track corresponding to the first column of the image array is connected to the first reference voltage node;
    the resistor of the reference cell of the first assembly coupled to the conductive track corresponding to the last column of the image array is connected to the second reference voltage node;
    the resistor of the reference cell of the second assembly coupled to the conductive track corresponding to the first column of the sensor image array is connected to the second reference voltage node; and
    the resistor of the reference cell of the second assembly coupled to the conductive track corresponding to the last column of the image array is connected to the first reference voltage node.

9. The sensor of claim 7, wherein the test circuit includes a second row that includes the cells of the second assembly and a third control line coupled to respective control nodes of the elementary reference cells of the second assembly.

10. The sensor of claim 7, wherein the cells of the first assembly and the cells of the second assembly are alternately arranged along a first row of simultaneously-controllable elementary reference cells and along a second row of simultaneously-controllable elementary reference cells.

11. A method of operating a CMOS image sensor, the method comprising:
    resetting plural sense nodes of plural pixels, respectively, in a selected row an image array that includes M rows and N columns of pixels and N output conductive tracks corresponding respectively to the N columns, where for each column, the pixels of the column are connected to the corresponding output conductive track, and the pixels of different columns are connected to different output conductive tracks, each pixel including a photodiode, a sense node, a transfer transistor coupling the sense node to a first node of the photodiode, a reset transistor coupling the sense node to a pixel reset voltage node, and a read circuit coupling the sense node to the output conductive track corresponding to the column that includes the pixel, the resetting including turning on the reset transistors of the pixels of the selected row;
    reading a voltage of the sense node of each pixel in the selected row;

turning on the transfer transistor of each pixel in the selected row;

reading the voltage of the sense node of each pixel in the selected row;

turning on transfer transistors of cells, respectively, in a row of a test circuit that includes a first assembly of N elementary reference cells respectively coupled to the N output conductive tracks, each elementary reference cell including a resistor, a sense node, a transfer transistor coupling the sense node of the elementary reference cell to a first node of the resistor, a reset transistor coupling the sense node of the elementary reference cell to a cell reset voltage node, and a read circuit coupling the sense node of the elementary reference cell to the output track to which the elementary reference cell is coupled, the resistors of said first assembly being series-coupled between first and second reference voltage nodes;

reading a voltage of the sense node of each cell in the row of the test circuit;

resetting the sense node of each cell in the row of the test circuit by turning on the reset transistor of each cell; and reading the voltage of the sense node of each cell in the row of the test circuit.

12. The method of claim 11, wherein:

resetting plural sense nodes occurs before reading the voltage of the sense node of each pixel in the selected row, which occurs before turning on the transfer transistor of each pixel in the selected row, which occurs before reading the voltage of the sense node of each pixel in the selected row; and turning on the transfer transistors of the cells in the row of the test circuit occurs before reading the voltage of the sense node of each cell in the row of the test circuit, which occurs before resetting the sense node of each cell in the row of the test circuit, which occurs before reading the voltage of the sense node of each cell in the row of the test circuit.

13. The method of claim 11, comprising reading the cell reset voltages before reading reference voltages of cells.

* * * * *